United States Patent
Goto et al.

(10) Patent No.: US 7,294,682 B2
(45) Date of Patent: Nov. 13, 2007

(54) CURABLE SILICONE RESIN COMPOSITION

(75) Inventors: Tomoyuki Goto, Annaka (JP); Eiichi Tabei, Annaka (JP); Akira Yamamoto, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 216 days.

(21) Appl. No.: 10/942,837

(22) Filed: Sep. 17, 2004

(65) Prior Publication Data

US 2005/0061437 A1    Mar. 24, 2005

(30) Foreign Application Priority Data

Sep. 19, 2003 (JP) ............................. 2003-327372

(51) Int. Cl.
*G08G 77/20* (2006.01)
(52) U.S. Cl. .................. 528/35; 528/31; 528/32; 528/43
(58) Field of Classification Search ............ 528/31, 528/35, 32, 43
See application file for complete search history.

(56) References Cited

U.S. PATENT DOCUMENTS

| | | | |
|---|---|---|---|
| 5,998,925 A | 12/1999 | Shimizu et al. | |
| 6,069,440 A | 5/2000 | Shimizu et al. | |
| 6,310,146 B1 * | 10/2001 | Katsoulis et al. | ........... 525/477 |
| 6,608,332 B2 | 8/2003 | Shimizu et al. | |
| 6,614,179 B1 | 9/2003 | Shimizu et al. | |
| 2003/0171476 A1 * | 9/2003 | Li et al. | ..................... 524/492 |

FOREIGN PATENT DOCUMENTS

| | | |
|---|---|---|
| JP | 10-22849 | 8/1998 |
| JP | 2000-123981 | 4/2000 |

OTHER PUBLICATIONS

U.S. Appl. No. 11/087,599, filed Mar. 24, 2005, Tabei et al.
U.S. Appl. No. 10/960,048, filed Oct. 8, 2004, Tabei.
U.S. Appl. No. 10/942,837, filed Sep. 17, 2004, Goto et al.

* cited by examiner

*Primary Examiner*—Kuo-Liang Peng
(74) *Attorney, Agent, or Firm*—Oblon, Spivak, McClelland, Maier & Neustadt, P.C.

(57) ABSTRACT

A curable silicone resin composition is provided. It includes (A) an aromatic ring-containing hydrocarbon compound containing at least 2 silicon-bonded hydrogen atoms, in which the silicon atoms are bonded to the hydrocarbon skeleton; (B) an organopolysiloxane with a branched or three dimensional network structure, and with a viscosity at 25° C. of at least 1,000 mPa·s, having an average composition formula (1):

$$R^1_x SiO_{(4-x)/2} \qquad (1)$$

wherein, $R^1$ independently represent a substituted or unsubstituted monovalent hydrocarbon group, a substituted or unsubstituted hydrocarbyloxy group, or a hydroxyl group, provided from 0.1 to 80 mol % of all the $R^1$ groups are alkenyl groups, and x represents a positive number that satisfies $1 \leq x < 2$; and (C) a hydrosilylation reaction catalyst. The composition yields a cured product that is transparent and displays excellent hardness and flexural strength.

8 Claims, No Drawings

CURABLE SILICONE RESIN COMPOSITION

FIELD OF THE INVENTION

The present invention relates to a curable silicone resin composition which yields a cured product that is transparent and displays excellent hardness and flexural strength.

DESCRIPTION OF THE PRIOR ART

Conventionally, epoxy resins have normally been used as the sealing material for optical material members, and particularly for light emitting diode (LED) elements. In the case of silicone resins, tests have been conducted relating to their use as molded members for LED elements (JP10-228249A, and U.S. Pat. Nos. 5,998,925, 6,069,440, 6,608,332, and 6,614,179), or their use as color filter materials (JP2000-123981A), although actual applications are few.

In recent years, with white LEDs attracting considerable attention, factors which until now have been considered unimportant, such as the yellowing of epoxy sealing materials caused by ultraviolet light or the like, and the appearance of cracks and the like caused by the increases in heating value accompanying miniaturization, now require solutions.

SUMMARY OF THE INVENTION

An object of the present invention is to resolve the problems described above, by providing a curable silicone resin composition which yields a cured product that is transparent and displays excellent hardness and flexural strength.

The present invention provides a curable silicone resin composition comprising:

(A) an aromatic ring-containing hydrocarbon compound containing at least 2 hydrogen atoms bonded to silicon atoms within each molecule, in which the silicon atoms are bonded to the hydrocarbon skeleton of said hydrocarbon compound, (B) an organopolysiloxane with a branched or three dimensional network structure, and with a viscosity at 25° C. of at least 1,000 mPa·s, represented by an average composition formula (1) shown below:

$$R^1_x SiO_{(4-x)/2} \quad (1)$$

[wherein, the $R^1$ groups are either identical or different, and each represent a substituted or unsubstituted monovalent hydrocarbon group, a substituted or unsubstituted hydrocarbyloxy group, or a hydroxyl group, provided from 0.1 to 80 mol % of all the $R^1$ groups are alkenyl groups, and x represents a positive number that satisfies $1 \leq x < 2$], and (C) a hydrosilylation reaction catalyst.

By applying a composition of the present invention, a curable silicone resin composition is obtained which yields a cured product that is transparent and displays excellent hardness and flexural strength.

DETAILED DESCRIPTION OF THE PREFERRED EMBODIMENTS

As follows is a more detailed description of a curable silicone resin composition of the present invention. The curable silicone resin composition comprises the components (A) through (C) detailed above.

[(A) Aromatic Ring-containing Hydrocarbon Compound]

The component (A) is an aromatic ring-containing hydrocarbon compound containing at least 2 hydrogen atoms bonded to silicon atoms (hereafter referred to as "Si—H groups") within each molecule, in which the silicon atoms are bonded to the hydrocarbon skeleton. The aromatic ring-containing hydrocarbon compound preferably contains from 2 to 5, and even more preferably from 2 to 3, of the above Si—H groups within each molecule. If there are fewer than 2 of these Si—H groups within each molecule, then the composition does not cure adequately.

Examples of the aromatic ring include an o-, m- or p-phenylene group, a tolylene group, an o-, m- or p-xylylene group, bivalent arylene groups represented by the general formulas shown below:

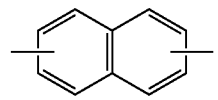 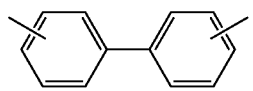

and substituted arylene groups in which a portion (typically from 1 to 8, and preferably from 1 to 4) of the hydrogen atoms of the above aromatic rings have been substituted with alkyl groups such as methyl groups, or halogen atoms such as fluorine or chlorine, and of these groups, an o-, m- or p-phenylene group, a tolylene group, an o-, m- or p-xylylene group, or a biphenylene group are preferred, and an o-, m- or p-phenylene group is particularly desirable.

There are no particular restrictions on the aromatic ring-containing hydrocarbon compound, provided it satisfies the above conditions, although compounds represented by the general formula (2) below are preferred:

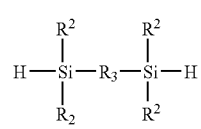

[wherein, the $R^2$ groups are either identical or different, and each represent a hydrogen atom, a substituted or unsubstituted monovalent hydrocarbon group of 1 to 12 carbon atoms other than an aliphatic unsaturated hydrocarbon group, or a substituted or unsubstituted alkoxy group of 1 to 6 carbon atoms, and $R^3$ represents a substituted or unsubstituted bivalent aromatic group-containing hydrocarbon group of 6 to 12 carbon atoms].

In the above formula (2), each $R^2$ preferably represents a hydrogen atom, a substituted or unsubstituted monovalent hydrocarbon group other than an aliphatic unsaturated hydrocarbon group, containing from 1 to 8, and even more preferably from 1 to 6, carbon atoms, or a substituted or unsubstituted alkoxy group of 1 to 4, and even more preferably from 1 to 2, carbon atoms.

Examples of suitable substituted or unsubstituted monovalent hydrocarbon groups other than aliphatic unsaturated hydrocarbon groups represented by $R^2$ include alkyl groups such as methyl groups, ethyl groups, propyl groups, isopropyl groups, butyl groups, tert-butyl groups, pentyl groups, isopentyl groups, hexyl groups and sec-hexyl groups; aryl groups such as phenyl groups, and o-, m- and p-tolyl groups; aralkyl groups such as benzyl groups and 2-phenylethyl groups; as well as groups in which either a portion of, or all of, the hydrogen atoms within an aforementioned group have been substituted with halogen atoms, cyano groups, or epoxy-containing groups or the like, including halogenated alkyl groups such as chloromethyl groups, 3-chloropropyl groups and 3,3,3-trifluoropropyl groups, as well as 2-cyanoethyl groups and 3-glycidoxypropyl groups, and of these groups, alkyl groups and aryl groups are preferred, and methyl groups, ethyl groups and phenyl groups are particularly desirable.

In the above formula (2), examples of suitable substituted or unsubstituted alkoxy groups represented by $R^2$ include methoxy groups, ethoxy groups, propoxy groups, isopropoxy groups, butoxy groups, sec-butoxy groups, tert-butoxy groups and methoxyethoxy groups, and of these, methoxy groups, ethoxy groups, propoxy groups and isopropoxy groups are preferred, and methoxy groups and ethoxy groups are particularly desirable.

Of the possible combinations, compounds in which all of the $R^2$ groups are methyl groups are particularly preferred in terms of the ease with which they can be produced industrially, and their resulting availability.

In the above formula (2), $R^3$ preferably represents a substituted or unsubstituted bivalent aromatic group-containing hydrocarbon group of 6 to 10, and even more preferably from 6 to 8, carbon atoms. Examples of suitable bivalent aromatic group-containing hydrocarbon groups represented by $R^3$ include the specific examples of aromatic rings described above in relation to the aromatic ring-containing hydrocarbon compound, and of these, an o-, m- or p-phenylene group, an o-, m- or p-xylylene group, or a biphenylene group is preferred, and an o-, m- or p-phenylene group is particularly desirable.

Specific examples of the component (A) include the compounds shown below. In the following formulas, "Et" represents an ethyl group, and "Ph" represents a phenyl group.

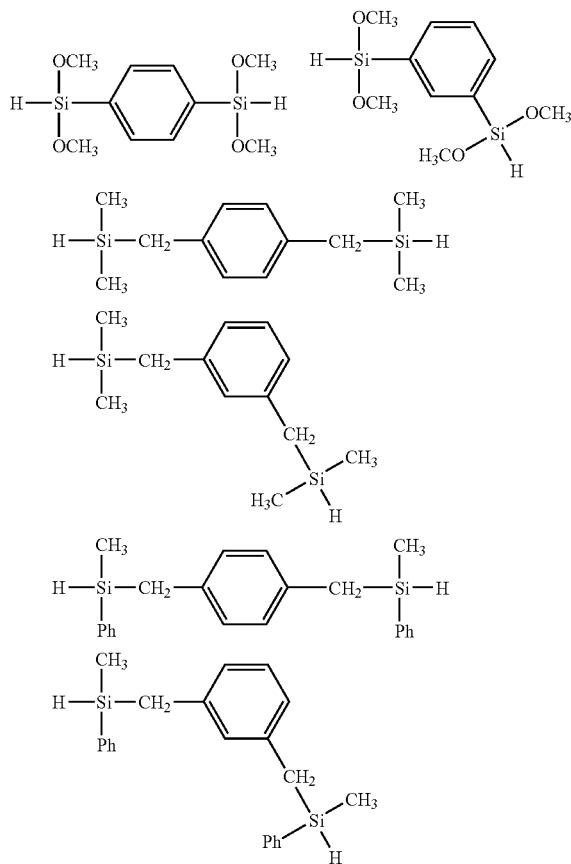

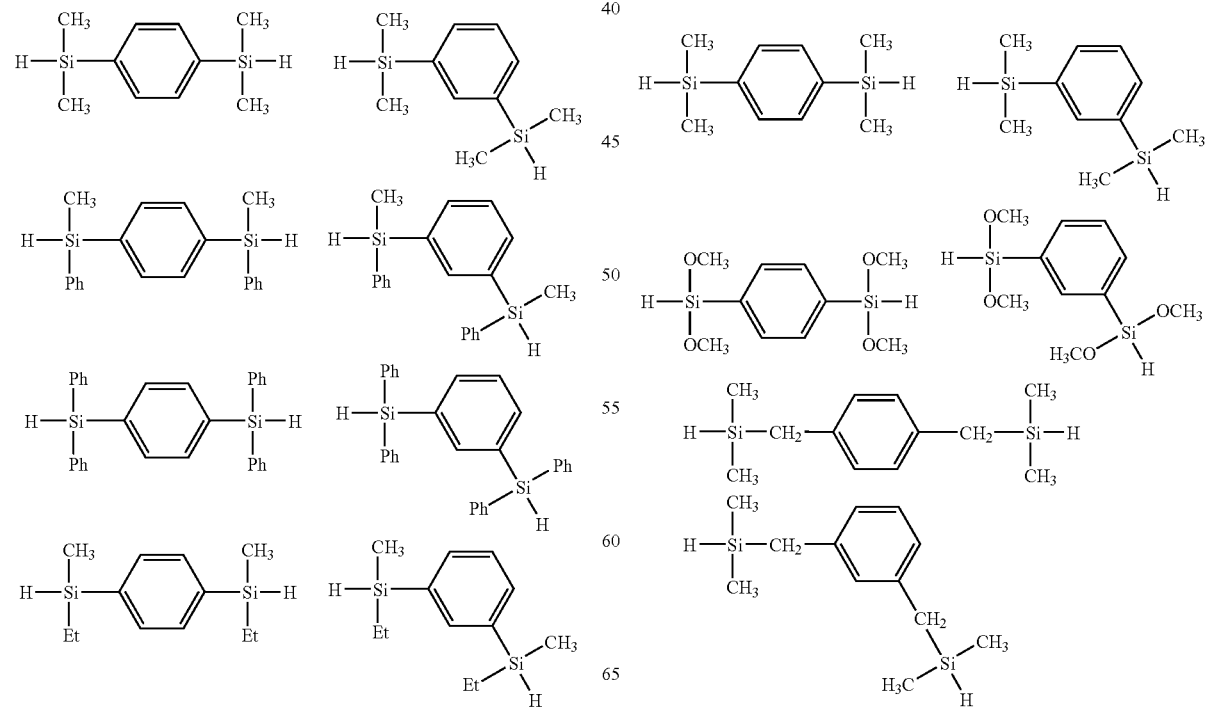

Of the compounds shown above, from the viewpoint of ease of synthesis, are preferred, and

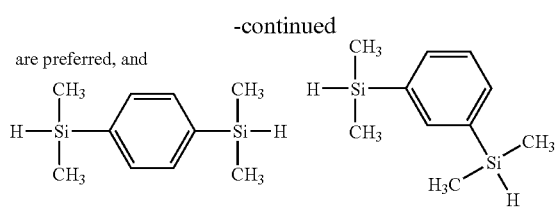

are even more desirable.

The aromatic ring-containing hydrocarbon compound can use either a single compound, or a combination of two or more different compounds.

There are no particular restrictions on the quantity of the component (A), and typical quantities are from 3 to 100 parts by weight, and preferably from 5 to 90 parts by weight, and even more preferably from 10 to 80 parts by weight, per 100 parts by weight of the component (B) described below. When the quantity of this component falls within this range from 3 to 100 parts by weight, the resulting composition displays a viscosity that is suitable for molding, and the cured product obtained by curing the composition displays satisfactory levels of hardness and flexural strength.

Of those compositions that satisfy the above condition, those in which the quantity of Si—H groups within the component (A) is within a range from 0.1 to 6.0 mols, and preferably from 0.2 to 3.0 mols, and even more preferably from 0.3 to 2.0 mols, per 1 mol of alkenyl groups within the component (B) are the most desirable. If the above range from 0.1 to 6.0 mols is satisfied, then a cured product can be formed which is extremely hard and displays excellent flexural strength.

[(B) Organopolysiloxane]

An organopolysiloxane of the component (B) is represented by the average composition formula (1) shown above. The organopolysiloxane has a branched or three dimensional network structure comprising at least one of $R^1SiO_{3/2}$ [wherein, $R^1$ is as defined above in the formula (1)] units and $SiO_2$ units within the molecule, and is preferably a three dimensional network structure comprising $R^1SiO_{3/2}$ units such as $(C_6H_5)SiO_{3/2}$ units.

The viscosity at 25° C. of the organopolysiloxane must be at least 1,000 mPa·s, and is preferably at least 100,000 mPa·s, and even more preferably at least 500,000 mPa·s, and most preferably 1,000,000 mPa·s or greater. If this viscosity is less than 1,000 mPa·s, then there is a danger that the flexural strength of the cured product may decrease. There are no particular restrictions on the upper limit of the viscosity of this organopolysiloxane, and even semifluids or solids that show slight or almost no fluidity at room temperature (25° C.) can be used. The organopolysiloxane in a semifluid state may normally take an upper limit viscosity of 100,000,000 mPa·s, and further even a viscosity of 1,000,000,000 mPa·s at 25° C.

In the above formula (1), $R^1$ represents a substituted or unsubstituted monovalent hydrocarbon group of 1 to 20, and preferably from 1 to 10, carbon atoms, a substituted or unsubstituted hydrocarbyloxy group such as an alkoxy group, an alkenyloxy group or an aryloxy group of 1 to 20, and preferably from 1 to 10, and even more preferably from 1 to 6, carbon atoms, or a hydroxyl group.

Examples of suitable substituted or unsubstituted monovalent hydrocarbon groups represented by $R^1$ include aliphatic saturated hydrocarbon groups, including alkyl groups such as methyl groups, ethyl groups, propyl groups, isopropyl groups, butyl groups, tert-butyl groups, and hexyl groups, and cycloalkyl groups such as cyclohexyl groups; aromatic hydrocarbon groups, including aryl groups such as phenyl groups, tolyl groups, xylyl groups and naphthyl groups, and aralkyl groups such as benzyl groups and phenylethyl groups; and aliphatic unsaturated hydrocarbon groups, including, alkenyl groups such as vinyl groups, allyl groups, propenyl groups, isopropenyl groups and butenyl groups; as well as groups in which either a portion of, or all of, the hydrogen atoms within an aforementioned group have been substituted with halogen atoms or cyano groups or the like, including halogenated alkyl groups such as 3,3,3-trifluoropropyl groups, and of these groups, alkyl groups, aryl groups, alkenyl groups and halogenated alkyl groups are preferred, and methyl groups, ethyl groups, phenyl groups, vinyl groups allyl groups, and 3,3,3-trifluoropropyl groups are particularly desirable.

Examples of suitable substituted or unsubstituted hydrocarbyloxy groups represented by $R^1$ include methoxy groups, ethoxy groups, propoxy groups and phenoxy groups, or alternatively, groups in which a portion of, or all of, the hydrogen atoms of the above groups have been substituted with an alkoxy group or the like, including alkoxy substituted hydrocarbyloxy groups such as methoxyethoxy groups and ethoxyethoxy groups, and of these groups, methoxy groups, ethoxy groups and propoxy groups are preferred, and methoxy groups and ethoxy groups are particularly desirable.

In the above formula (1), from 0.1 to 80 mol % of all the $R^1$ groups must be alkenyl groups, and this proportion of alkenyl groups is preferably from 0.3 to 70 mol %, and even more preferably from 0.5 to 60 mol %. If this alkenyl group content is less than 0.1 mol %, then it becomes difficult to achieve the required hardness for the silicone resin cured product, whereas if the content exceeds 80 mol %, the number of cross-linking points becomes overly large, and the resulting silicone resin cured product can become very brittle.

In the formula (1), x must be a positive number that satisfies 1≦x<2, and is preferably a positive number that satisfies 1.1≦x≦1.95, and even more preferably 1.2≦x≦1.9. If x is either smaller than 1, or 2 or greater, then it becomes difficult to achieve the required hardness and strength for the silicone resin cured product.

There are no particular restrictions on the organopolysiloxane, providing it satisfies the conditions described above, although from the viewpoint of not only ensuring a significant improvement in the flexural strength of the silicone resin cured product, but also achieving an increase in the refractive index, a phenyl group-containing organopolysiloxane, with a viscosity at 25° C. of at least 1,000 mPa·s, represented by an average composition formula (3) shown below is preferred:

$$R^4{}_m(C_6H_5)_nSiO_{\{(4-m-n)/2\}} \quad (3)$$

[wherein, the $R^4$ groups are either identical or different, and each represent a substituted or unsubstituted monovalent hydrocarbon group other than a phenyl group, a substituted or unsubstituted alkoxy group, or a hydroxyl group, provided from 0.1 to 80 mol % of all the $R^4$ groups are alkenyl groups, m represents a positive number that satisfies 0.1≦m<1.8, and n represents a positive number that satisfies 0.2≦n<1.9, provided 1≦m+n<2, and 0.20≦n/(m+n)≦0.95].

There are no particular restrictions on this phenyl group-containing organopolysiloxane, provided the viscosity at 25° C. is at least 1,000 mPa·s, although the viscosity is preferably at least 10,000 mPa·s, and even more preferably at least 50,000 mPa·s, and most preferably 100,000 mPa·s or greater. If the viscosity is less than 1,000 mPa·s, then the flexural strength of the cured product may decrease.

In the above formula (3), $R^4$ represents a substituted or unsubstituted monovalent hydrocarbon group other than a phenyl group, typically containing from 1 to 20, and preferably from 1 to 10, carbon atoms, a substituted or unsubstituted alkoxy group of 1 to 20, and preferably from 1 to 10, and even more preferably from 1 to 6, carbon atoms, or a hydroxyl group.

In the formula (3), examples of suitable substituted or unsubstituted monovalent hydrocarbon groups other than phenyl groups represented by $R^4$ include the same substituted and unsubstituted monovalent hydrocarbon groups described for the $R^1$ group, but excluding phenyl groups and those groups in which either a portion of, or all of, the hydrogen atoms of a phenyl group have been substituted, and of these groups, alkyl groups, alkenyl groups and halogenated alkyl groups are preferred, and methyl groups, ethyl groups, vinyl groups, allyl groups and 3,3,3-trifluoropropyl groups are even more desirable.

In the above formula (3), from 0.1 to 80 mol % of all the $R^4$ groups must be alkenyl groups, and this proportion of alkenyl groups is preferably from 0.3 to 70 mol %, and even more preferably from 0.5 to 60 mol %. If this alkenyl group content is less than 0.1 mol %, then it becomes difficult to achieve the required hardness for the silicone resin cured product, whereas if the content exceeds 80 mol %, the number of cross-linking points becomes overly large, and the resulting silicone resin cured product can become very brittle.

In the formula (3), m must be a positive number that satisfies $0.1 \leq m < 1.8$, and is preferably a positive number that satisfies $0.2 \leq m \leq 1.6$, and even more preferably $0.3 \leq m \leq 1.4$. n must be a positive number that satisfies $0.2 \leq n < 1.9$, and is preferably a positive number that satisfies $0.25 \leq n \leq 1.7$, and even more preferably $0.3 \leq n \leq 1.5$. However, the relationship $1 \leq m+n < 2$ must be satisfied, and m and n are preferably positive numbers that satisfy $1.1 \leq m+n \leq 1.9$, and even more preferably $1.2 \leq m+n \leq 1.8$, and in addition, the relationship $0.20 \leq n/(m+n) \leq 0.95$ must also be satisfied, and m and n are preferably positive numbers that satisfy $0.25 \leq n/(m+n) \leq 0.90$, and even more preferably $0.3 \leq n/(m+n) \leq 0.85$. If m is smaller than 0.1, then the hardness of the cured product may decrease, whereas if m is 1.8 or greater, then the effect of the phenyl groups in increasing the refractive index may not manifest satisfactorily. If n is smaller than 0.2, then the effect of the phenyl groups in increasing the refractive index may not manifest satisfactorily, whereas if n is 1.9 or greater, then the hardness of the cured product may decrease. If the value of m+n is either smaller than 1, or 2 or greater, then it becomes difficult to achieve the required hardness and strength for the silicone resin cured product.

These organopolysiloxanes can either be used singularly, or in combinations of two or more different compounds.

[(C) Hydrosilylation Reaction Catalyst]

A hydrosilylation catalyst of the component (C) is a material that accelerates the curing of the obtained silicone resin composition. This hydrosilylation catalyst can use any of the conventionally available products. Specific examples include platinum based catalysts such as platinum black, platinum (IV) chloride, chloroplatinic acid, reaction products of chloroplatinic acid and monovalent alcohols, complexes of chloroplatinic acid and olefins, and platinum bisacetoacetate; as well as other platinum group metal catalysts such as palladium based catalysts and rhodium based catalysts, and of these different catalysts, platinum based catalysts and palladium based catalysts are preferred, and platinum based catalysts are particularly desirable.

There are no particular restrictions on the quantity used of the component (C), and any effective catalytic quantity is adequate, although a typical quantity, calculated as the weight of platinum group metal atoms relative to the combined weight of the component (A) and the component (B) (and the component (D), in those cases where the component (D), described below, is also added to the composition), is from 0.01 to 1,000 ppm, and preferably from 0.05 to 500 ppm, and even more preferably from 0.1 to 500 ppm.

[(D) Organohydrogenpolysiloxane]

An organohydrogenpolysiloxane of the component (D) is added as required to increase the hardness and flexural strength of the obtained composition. The component (D) is an organohydrogenpolysiloxane containing an average of at least 2 Si—H groups within each molecule, and with a viscosity at 25° C. of no more than 1,000 mPa·s, represented by an average composition formula (4) shown below:

[wherein, the $R^5$ groups are either identical or different, and each represent a substituted or unsubstituted monovalent hydrocarbon group other than an aliphatic unsaturated hydrocarbon group, a represents a positive number that satisfies $0.5 \leq a \leq 2.1$, and b represents a positive number that satisfies $0.01 \leq b \leq 1.0$, provided $0.8 \leq a+b \leq 2.6$].

The organohydrogenpolysiloxane preferably contains an average of at least 3 (typically from 3 to 200), and even more preferably from 3 to 100, of the aforementioned Si—H groups within each molecule. The average of at least 2, and preferably average of at least 3, Si—H groups within each molecule may be positioned at either the molecular chain terminals or at non-terminal positions within the molecular chain, or may also be positioned at both of these positions. Furthermore, the viscosity at 25° C. is preferably within a range from 0.5 to 1,000 mPa·s, and even more preferably from 1 to 500 mPa·s.

The molecular structure of the organohydrogenpolysiloxane may be a straight chain, branched, cyclic, or three dimensional network structure, and the number of silicon atoms within each molecule (or the degree of polymerization) is typically within a range from 2 to 300, and preferably from 4 to approximately 150.

In the above formula (4), $R^5$ represents a substituted or unsubstituted monovalent hydrocarbon group other than an aliphatic unsaturated hydrocarbon group, typically containing from 1 to 20, and preferably from 1 to 10, and even more preferably from 1 to 6, carbon atoms. Examples of suitable monovalent hydrocarbon groups represented by $R^5$ include saturated hydrocarbon groups, including alkyl groups such as methyl groups, ethyl groups, propyl groups, isopropyl groups, butyl groups, tert-butyl groups, and hexyl groups, and cycloalkyl groups such as cyclohexyl groups; aryl groups such as phenyl groups and tolyl groups; aralkyl groups such as benzyl groups and phenylethyl groups; as well as groups in which either a portion of, or all of, the hydrogen atoms within an aforementioned group have been substituted with halogen atoms or cyano groups or the like, including halogen substituted and cyano substituted monovalent hydrocarbon groups such as 3,3,3-trifluoropropyl groups, and of these groups, alkyl groups, aryl groups, and halogenated monovalent hydrocarbon groups are preferred, and methyl groups and phenyl groups are particularly desirable.

a must be a positive number that satisfies $0.5 \leq a \leq 2.1$, and is preferably a positive number that satisfies $0.7 \leq a \leq 2.0$, and even more preferably $1.0 \leq a \leq 1.8$. b must be a positive number that satisfies $0.01 \leq b \leq 1.0$, and is preferably a positive number that satisfies $0.02 \leq b \leq 1.0$, and even more preferably $0.10 \leq b \leq 1.0$. However, the relationship $0.8 \leq a+b < 2.6$ must be satisfied, and a and b are preferably positive numbers that satisfy $1.01 \leq a+b \leq 2.4$, and even more preferably $1.6 \leq a+b \leq 2.2$. If b is less than 0.01, then the hardness of the silicone resin cured product may actually decrease.

In addition, the above organohydrogenpolysiloxane preferably satisfies at least one of the conditions shown below:

(i) the $R^5$ groups within the average composition formula (4) include phenyl groups, and the ratio of phenyl groups relative to the combination of all the $R^5$ groups and all the hydrogen atoms is at least 3 mol %, and preferably at least 5 mol %, and even more preferably within a range from 10 to 60 mol %, and (ii) a molecular weight of no more than 500, and preferably within a range from 100 to 450, and even more preferably from 130 to 400. If one of the above conditions (i) and (ii) is satisfied, then the co-solubility of the organohydrogenpolysiloxane with the component (B) is favorable. From the viewpoint of ease of synthesis, those $R^5$ groups that are not phenyl groups are preferably methyl groups.

Specific examples of the above organohydrogenpolysiloxane include 1,1,3,3-tetramethyldisiloxane, 1,3,5,7-tetramethylcyclotetrasiloxane, tris(hydrogendimethylsiloxy)methylsilane, tris(hydrogendimethylsiloxy)phenylsilane, methylhydrogencyclopolysiloxane, cyclic copolymers of methylhydrogensiloxane and dimethylsiloxane, methylhydrogenpolysiloxane with both terminals blocked with trimethylsiloxy groups, copolymers of dimethylsiloxane and methylhydrogensiloxane with both terminals blocked with trimethylsiloxy groups, dimethylpolysiloxane with both terminals blocked with dimethylhydrogensiloxy groups, copolymers of dimethylsiloxane and methylhydrogensiloxane with both terminals blocked with dimethylhydrogensiloxy groups, copolymers of methylhydrogensiloxane and diphenylsiloxane with both terminals blocked with trimethylsiloxy groups, copolymers of methylhydrogensiloxane, diphenylsiloxane and dimethylsiloxane with both terminals blocked with trimethylsiloxy groups, copolymers of methylhydrogensiloxane, methylphenylsiloxane and dimethylsiloxane with both terminals blocked with trimethylsiloxy groups, copolymers of methylhydrogensiloxane, dimethylsiloxane and diphenylsiloxane with both terminals blocked with dimethylhydrogensiloxy groups, copolymers of methylhydrogensiloxane, dimethylsiloxane and methylphenylsiloxane with both terminals blocked with dimethylhydrogensiloxy groups, copolymers formed from $(CH_3)_2HSiO_{1/2}$ units, $(CH_3)_3SiO_{1/2}$ units and $SiO_{4/2}$ units, copolymers formed from $(CH_3)_2HSiO_{1/2}$ units and $SiO_{4/2}$ units, and copolymers formed from $(CH_3)_2HSiO_{1/2}$ units, $SiO_{4/2}$ units and $(C_6H_5)SiO_{3/2}$ units.

The quantity added of the component (D) is preferably within a range from 0 to 60 parts by weight, and even more preferably from 1 to 45 parts by weight, and most preferably from 1 to 30 parts by weight, per 100 parts by weight of the component (B). In addition, in order to ensure that the viscosity of the obtained composition is appropriate for molding, and that the hardness and flexural strength of the cured product obtained on curing the composition are favorable, the combined quantity of the component (D) and the component (A) is preferably within a range from 3 to 100 parts by weight, and even more preferably from 5 to 90 parts by weight, and most preferably from 10 to 80 parts by weight, per 100 parts by weight of the component (B).

Of those compositions that satisfy the above conditions, those in which the combined total of Si—H groups within the component (A) and the component (D) is within a range from 0.3 to 5.0 mols, and preferably from 0.4 to 4.0 mols, and even more preferably from 0.5 to 3.0 mols, per 1 mol of alkenyl groups within the component (B) are the most desirable. If the above range from 0.3 to 5.0 mols is satisfied, then the flexural strength of the obtained cured product can be further increased.

[Other Optional Components]

Other optional components outside of the aforementioned components (A) to (C) (and the component (D) where included) may also be added to a composition of the present invention for purposes such as regulating the curing rate or the storage stability of the product composition, provided such addition does not impair the effects of the present invention. Specific examples of these optional components include vinyl group-containing organopolysiloxanes such as methylvinylcyclotetrasiloxane, reaction control agents such as triallyl isocyanurate, and acetylene alcohol or a siloxane modified product thereof, and regulating agents for controlling the hardness or viscosity or the like such as straight chain reactive organopolysiloxanes, and straight chain or cyclic low molecular weight organopolysiloxanes with 2 to 10 silicon atoms.

Furthermore, inorganic fillers such as fumed silica may also be added to improve the strength of the cured product, provided the addition does not impair the transparency of the obtained cured product. In addition, adhesion imparting agents, wavelength control agents, pigments, flame retardants, heat resistance agents, and antioxidants and the like may also be added as required.

[Curing Method]

There are no particular restrictions on the method used for curing the silicone resin composition of the present invention, and suitable examples include methods in which the composition is prepared, molded, and then cured by standing at room temperature (20 to 40° C.), and methods in which the composition is prepared, molded, and then cured by heating at 50 to 200° C. Furthermore, in those cases where a composition of the present invention is used to produce a desired molded product, there are no particular restrictions on the molding method used, although casting methods are preferred.

EXAMPLES

As follows is a more detailed description of the present invention using a series of examples, although the present invention is in no way restricted to the examples presented below. In the following examples, the ratios of each of the units within the average composition formulas used to represent the organopolysiloxanes of the composition (B) are rounded to 2 decimal places.

Example 1

(A) 10 parts by weight of an aromatic ring-containing hydrocarbon compound represented by a formula (5) shown below:

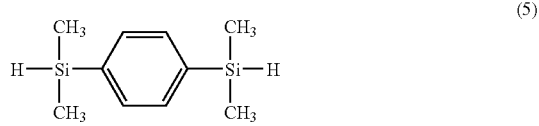
(5)

(B) 100 parts by weight of a semifluid organopolysiloxane with a three dimensional network structure and with a viscosity at 25° C. (viscosity: at least 100,000 mPa·s), produced by conducting a simultaneous hydrolysis (hereafter described as "co-hydrolysis") of phenyltrichlorosilane, methylvinyldichlorosilane and dimethyldichlorosilane, and represented by an average composition formula (6) shown below:

$$(CH_3)_{0.70}(C_6H_5)_{0.55}(CH_2=CH)_{0.20}SiO_{1.28} \quad (6)$$

(C) an isopropanol solution of chloroplatinic acid: in sufficient quantity to provide 40 ppm of platinum metal atoms, on a weight basis, relative to the combined weight of the component (A), the component (B) and the component (D), and (D) 10 parts by weight of an organohydrogenpolysiloxane with a viscosity at 25° C. of 20 mPa·s, represented by an average composition formula (7) shown below:

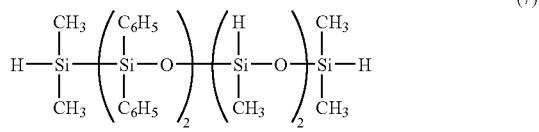
(7)

were combined, and then mixed to form a uniform composition, thus yielding a silicone resin composition 1. Following degassing, this silicone resin composition 1 was poured into a mold of dimensions 10 mm×100 mm and a depth of 4 mm, and was then heated at 120° C. for 1 hour, and then at 150° C. for a further 1 hour, thus forming a silicone resin cured product 1.

Example 2

(A) 25 parts by weight of the aromatic ring-containing hydrocarbon compound represented by the above formula (5), (B) 100 parts by weight of a semifluid organopolysiloxane with a three dimensional network structure and with a viscosity at 25° C. (viscosity: at least 100,000 mPa·s), produced by conducting a co-hydrolysis of phenyltrichlorosilane, methylvinyldichlorosilane and diphenyldichlorosilane, and represented by an average composition formula (8) shown below:

$$(CH_3)_{0.40}(C_6H_5)_{0.75}(CH_2=CH)_{0.40}(OH)_{0.13}SiO_{1.16} \quad (8)$$

(C) an isopropanol solution of chloroplatinic acid: in sufficient quantity to provide 40 ppm of platinum metal atoms, on a weight basis, relative to the combined weight of the component (A), the component (B) and the component (D), and (D) 10 parts by weight of the organohydrogenpolysiloxane represented by the above average composition formula (7) and with a viscosity at 25° C. of 20 mPa·s were combined, and then mixed to form a uniform composition, thus yielding a silicone resin composition 2. Subsequently, the same method as the example 1 was used to produce a silicone resin cured product 2.

Example 3

(A) 30 parts by weight of the aromatic ring-containing hydrocarbon compound represented by the above formula (5), (B) 100 parts by weight of a semifluid organopolysiloxane with a three dimensional network structure and with a viscosity at 25° C. (viscosity: at least 100,000 mPa·s), produced by conducting a co-hydrolysis of phenyltrichlorosilane, methylvinyldichlorosilane and diphenyldichlorosilane, and represented by an average composition formula (9) shown below:

$$(CH_3)_{0.35}(C_6H_5)_{0.70}(CH_2=CH)_{0.35}(OH)_{0.03}SiO_{1.29} \quad (9)$$

(C) an isopropanol solution of chloroplatinic acid: in sufficient quantity to provide 40 ppm of platinum metal atoms, on a weight basis, relative to the combined weight of the component (A) and the component (B)

were combined, and then mixed to form a uniform composition, thus yielding a silicone resin composition 3. Subsequently, the same method as the example 1 was used to produce a silicone resin cured product 3.

Comparative Example 1

(B) 100 parts by weight of a solid organopolysiloxane with a three dimensional network structure and with substantially no fluidity at 25° C., produced by conducting an equilibration reaction of dimethyldimethoxysilane, methyltrimethoxysilane, tetramethoxysilane, hexamethyldisiloxane and tetramethyldivinyldisiloxane in the presence of an acid catalyst (sulfuric acid), and represented by an average composition formula (10) shown below:

$$(CH_3)_{0.74}(CH_2=CH)_{0.16}(OCH_3)_{0.06}SiO_{1.52} \quad (10)$$

(C) an isopropanol solution of chloroplatinic acid: in sufficient quantity to provide 40 ppm of platinum metal atoms, on a weight basis, relative to the combined weight of the component (B) and the component (D), and (D) 30 parts by weight of the organohydrogenpolysiloxane represented by the above average composition formula (7) and with a viscosity at 25° C. of 20 mPa·s were combined, and then mixed to form a uniform composition, thus yielding a silicone resin composition C1. Subsequently, the same method as the example 1 was used to produce a silicone resin cured product C1.

Comparative Example 2

(B) 100 parts by weight of the same organopolysiloxane used in the example 1, produced by co-hydrolysis of phenyltrichlorosilane, methylvinyldichlorosilane and dimethyldichlorosilane, and represented by the above average composition formula (6), (C) an isopropanol solution of chloroplatinic acid: in sufficient quantity to provide 40 ppm of platinum metal atoms, on a weight basis, relative to the combined weight of the component (B) and the component (D), and (D) 30 parts by weight of the organohydrogenpolysiloxane represented by the above average composition formula (7) and with a viscosity at 25° C. of 20 mPa·s were combined, and then mixed to form a uniform composition, thus yielding a silicone resin composition C2. Subsequently, the same method as the example 1 was used to produce a silicone resin cured product C2.

<Evaluation and Measurement Methods>

The characteristics of the silicone resin cured products obtained in each of the examples and comparative examples described above were evaluated and measured using the evaluation and measurement methods described below. The results obtained are shown in Table 1.

1. External Appearance

The external appearance of each cured product obtained above was inspected visually.

2. Hardness

The hardness (Shore D) of each cured product obtained above was measured in accordance with ASTM D 2240.

3. Flexural strength

Using the cured product of dimensions 10 mm×100 mm and a depth of 4 mm obtained above, the flexural strength (N) was measured in accordance with JIS K-6911, using a 3 point bending test.

TABLE 1

|  | Examples | | | Comparative examples | |
| --- | --- | --- | --- | --- | --- |
|  | 1 | 2 | 3 | 1 | 2 |
| External appearance | colorless, transparent | colorless, transparent | colorless, transparent | colorless, transparent | colorless, transparent |
| Hardness (shore D) | 74 | 78 | 73 | 45 | 73 |
| Flexural strength [N] | 34 | 50 | 50 | 4 | 16 |

<Evaluations>

The examples 1 to 3 are silicone resin compositions that satisfy the requirements of the present invention, and these compositions yield cured products with a transparent external appearance, and excellent levels of hardness and flexural strength.

The comparative example 1 is a silicone resin composition to which the component (A) was not added, and the cured product of this composition displays markedly inferior levels of hardness and flexural strength.

The comparative example 2 is a silicone resin composition to which the component (A) was not added, and the cured product of this composition displays a markedly inferior level of flexural strength.

INDUSTRIAL APPLICABILITY

This composition is useful as an optical material member, an insulating material for electronic materials, or as a keytop or the like, and can be potentially applied to these types of applications.

What is claimed is:

1. A curable silicone resin composition comprising:
   (A) an aromatic ring-containing hydrocarbon compound containing at least 2 hydrogen atoms bonded to silicon atoms within each molecule, in which said silicon atoms are bonded to the hydrocarbon skeleton of said hydrocarbon compound,
   (B) an organopolysiloxane with a branched or three dimensional network structure, and with a viscosity at 25° C. of at least 1,000 mPa·s, represented by an average composition formula (1) shown below:

$$R^1_x SiO_{(4-x)/2} \qquad (1)$$

wherein $R^1$ groups are either identical or different, and each represent a substituted or unsubstituted monovalent hydrocarbon group, a substituted or unsubstituted hydrocarbyloxy group, or a hydroxyl group, provided from 0.1 to 80 mol % of all said $R^1$ groups are alkenyl groups, and x represents a positive number that satisfies $1 \leq x < 2$,
   (C) a hydrosilylation reaction catalyst, and
   (D) an organohydrogenpolysiloxane containing an average of at least 2 hydrogen atoms bonded to silicon atoms within each molecule and with a viscosity at 25° C. of no more than 1,000 mPa·s represented by an average composition formula (4) shown below:

$$R^5_a H_b SiO_{(4-a-b)/2} \qquad (4)$$

wherein $R^5$ groups are either identical or different, and each represent a substituted or unsubstituted monovalent hydrocarbon group other than an aliphatic unsaturated hydrocarbon group, a represents a positive number that satisfies $0.5 \leq a \leq 2.1$, and b represents a positive number that satisfies $0.01 \leq b \leq 1.0$, provided $0.8 \leq a+b \leq 2.6$, and said organohydrogenpolysiloxane of said component (D) satisfies the following condition:
   (i) said $R^5$ groups within said average composition formula (4) include a phenyl group and a ratio of phenyl groups relative to a combination of all $R^5$ groups and all hydrogen atoms is at least 3 mol %.

2. The curable silicone resin composition according to claim 1, wherein said composition consists essentially of said aromatic ring-containing hydrocarbon compound of said component (A), said organopolysiloxane of said component (B), said hydrosilylation reaction catalyst of said component (C), and said organohydrogenpolysiloxane of said component (D).

3. A cured product obtained by curing a composition according to claim 2.

4. The curable silicone resin composition according to claim 1, wherein said aromatic ring-containing hydrocarbon compound of said component (A) is an aromatic ring-containing hydrocarbon compound representing a general formula (2) shown below:

(2)

wherein $R^2$ groups are either identical or different, and each represents a hydrogen atom, a substituted or unsubstituted monovalent hydrogen group of 1 to 12 carbon atoms other than an aliphatic unsaturated hydrocarbon group, or a substituted or unsubstituted alkoxy group of 1 to 6 carbon atoms, and $R^3$ represents a substituted or unsubstituted bivalent aromatic group-containing hydrocarbon group of 6 to 12 carbon atoms.

5. A cured product obtained by curing a composition according to claim 4.

6. The curable resin composition according to claim 1, wherein said organopolysiloxane of said component (B) is a phenyl-group containing organopolysiloxane with a viscosity of 25° C. of at least 1,000 mPa·s, represented by an average composition formula (3) shown below:

(3)

wherein $R^4$ groups are either identical or different and each represents a substituted or unsubstituted monovalent hydrocarbon group other than a phenyl group, a substituted or unsubstituted alkoxy group, or a hydroxyl group, provided from 0.1 to 80 mol % of all said $R^4$ groups are alkenyl groups, m represents a positive number that satisfies $0.1 \leq m \leq 1.8$, and n represents a positive number that satisfies $0.2 \leq n < 1.9$, provided $1 \leq m+n < 2$, and $0.20 \leq n/(m+n) \leq 0.95$.

7. A cured product obtained by curing a composition according to claim 6.

8. A cured product obtained by curing a composition according to claim 1.

* * * * *